United States Patent
Bothra et al.

[19]
[11] Patent Number: 6,133,635
[45] Date of Patent: *Oct. 17, 2000

[54] PROCESS FOR MAKING SELF-ALIGNED CONDUCTIVE VIA STRUCTURES

[75] Inventors: Subhas Bothra, San Jose; Jacob Haskell, Palo Alto, both of Calif.

[73] Assignee: Philips Electronics North America Corp., Tarrytown, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/884,795

[22] Filed: Jun. 30, 1997

[51] Int. Cl.$^7$ ..................................................... H01L 23/48
[52] U.S. Cl. ........................ 257/758; 257/748; 257/765; 257/771; 438/688; 438/669; 438/671
[58] Field of Search ...................................... 438/618, 669, 438/671, 720, 945, 688; 257/748, 758, 765, 771

[56] References Cited

U.S. PATENT DOCUMENTS

| | | |
|---|---|---|
| 4,536,951 | 8/1985 | Rhodes et al. . |
| 4,541,893 | 9/1985 | Knight . |
| 4,915,779 | 4/1990 | Strodes et al. . |
| 4,997,746 | 3/1991 | Greco et al. . |
| 5,292,393 | 3/1994 | Maydan et al. . |
| 5,369,053 | 11/1994 | Fang . |
| 5,439,847 | 8/1995 | Chittipeddi et al. . |
| 5,562,800 | 10/1996 | Kawamura et al. . |
| 5,565,707 | 10/1996 | Colgan et al. ........................ 257/762 |
| 5,599,742 | 2/1997 | Kadomura . |
| 5,665,641 | 9/1997 | Shen et al. . |
| 5,693,568 | 12/1997 | Liu et al. . |

FOREIGN PATENT DOCUMENTS 63-227018  9/1988  Japan .

OTHER PUBLICATIONS

S. Wolf and R.N. Tauber, "Silicon Processing for the VLSI Era, vol. 1", pp. 548–549 and 562–563.Lattice Press, CA, 1986.

Unknown, "Advanced Interconnection and Contact Schemes Based on TiSi$_2$ and CoSi$_2$ : Relevant Materials Issues and Technological Implementation", Ch. 111, Sec. 111.2.2., Jun. 1988, IMEC, Katholieke Universiteit Leuven, Dept. Elektrotechnik, Afdeling Esat—Divisie Insys.

*Primary Examiner*—C. Everhart
*Attorney, Agent, or Firm*—Martine Penilla & Kim, LLP

[57] ABSTRACT

Disclosed is a process for making a self-aligning conductive via structure in a semiconductor device. The process includes forming a first interconnect metallization layer over an oxide layer. Forming an etch stop layer over the first interconnect metallization layer. Forming a conductive via metallization layer over the etch stop layer. Forming a hard mask layer over the conductive via metallization layer. The process further includes producing a conductive via and an interconnect line, where the conductive via is formed from a portion of the conductive via metallization layer, and the interconnect line is formed from a portion of the first interconnect metallization layer. The conductive via is substantially aligned with the underlying interconnect line.

16 Claims, 13 Drawing Sheets

PROCESS FOR MAKING SELF-ALIGNED CONDUCTIVE VIA STRUCTURES

BACKGROUND OF THE INVENTION

1. Field of the Invention

The present invention relates generally to semiconductor circuits and, more particularly, to a process for making self-aligning conductive vias used in interconnection structures.

2. Description of the Related Art

Interconnect structures of integrated circuits (ICs) generally take the form of patterned metallization lines that are used to electrically interconnect devices and to provide interconnection with external circuitry. By way of example, IC devices may include metal oxide semiconductor ("MOS") devices having diffused source and drain regions separated by channel regions, and gates located over the channel regions. In practice, an IC chip may include thousands or millions of devices, such as MOS transistors.

Conventionally, a dielectric layer (e.g., silicon oxide) is deposited over the devices, and via holes are patterned and formed through the dielectric layer to the devices below. As is well known in the art, photolithography "patterning" is typically accomplished by depositing a photoresist layer over the dielectric layer, selectively exposing the photoresist to light through a patterned reticle having via hole patterns, developing the photoresist to form a resist via mask, and etching the exposed dielectric layer to form via holes leading to a lower level. Once the via holes are formed, a conductive material is used to fill the via holes to define what are known as "metal contacts." Once the metal contacts are formed, a metallization layer is formed over the dielectric layer and the contacts. The metallization layer is then patterned using conventional photolithography techniques to define a first level of interconnect metal routing. This process may then be repeated if additional layers of metallization lines are desired.

One problem with conventional metal contact interconnect structures is misalignments introduced in the photolithography process. As mentioned above, via holes are typically defined through a dielectric layer with the purpose of forming an "electrical" metal contact between a layer underlying the dielectric layer and a layer overlying the dielectric layer. As circuits become increasingly smaller and dense, interconnect structures between successive patterned metal layers have also become ever more dense. Unfortunately, conventional photolithography techniques are also being pushed to their limit, which has had the effect of introducing misalignments between patterned layers.

FIG. 1A is a cross sectional view of a conventional semiconductor device having a misaligned metal contact 28. The semiconductor device includes a semiconductor substrate 10 having diffusion regions 12 and a polysilicon gate 14 defined between the diffusion regions. A first dielectric layer 19 is deposited over the semiconductor substrate 10, the diffusion regions 12 and the polysilicon gate 14. Next, via holes are defined through the first dielectric layer 19 down to the polysilicon gate 14 and the diffusion region 12 (i.e., source/drain). The via holes are then conductively filled with tungsten or metal to define conductive contacts 16 and 18. In this example, conductive contacts 16 and 18 are somewhat misaligned, but no significant electrical problem occurred in this case. However, serious misalignments are shown to have occurred in the patterning of a conductive contact 28, which is defined through a second dielectric layer 22.

As can be appreciated, these type of misalignments are becoming ever more prevalent as device feature sizes continue to shrink. As illustrated, the misalignment of conductive contact 28, which is used to interconnect a metal-1 line 24 to a metal-2 line 30, may cause electrical shorts between adjacently patterned features. By way of example, when interconnect density patterns increase, layout "design rules" that are used by designers to determine the closest possible inter-feature spacings are necessarily pushed to their limits. That is, although features are designed to be adequately spaced apart to avoid electrical shorts between features, misalignments (which are unavoidable in dense photolithography patterning) will cause features to be laid out in arrangements that seriously violate minimum inter-feature separations dictated the design rules.

FIG. 1B is a block diagram illustrating the inter-feature violations caused when misalignments in conductive contacts occur. For exemplary purposes only, assuming that a 0.18 micron technology processes is used to fabricate the semiconductor device of FIG. 1A, the minimum inter-feature spacing "Sw" will be about 0.3 microns, and the features widths "Fw" will be about 0.3 microns. However, due to the aforementioned misalignment problems described above, an error width "Ew" of about ±0.09 microns must be accounted for due to photolithography misalignments. As such, the spacing between metal-1 line 24 and metal-2 line 30 will be dangerously close (i.e., about 0.21 microns or less), thereby exposing the semiconductor device to future failures due to electrical shorts, leakage currents, or performance degradation caused by electrical coupling. In any event, these misalignments are commonly to blame for substantial losses in yield as well as below average device reliability.

FIGS. 1C and 1D illustrate another problem caused by a misalignments in a conductive contact 34 defined through a third dielectric layer 35 to electrically connect to metal-2 line 30. In this example, although electrical interconnection is not desired between metal-1 line 24, the misaligned via hole will necessarily cause the formation of the conductive contact 34 dangerously close to metal-1 line 24. As shown in FIG. 1D, the separation 40 between these electrically distinct features are also commonly to blame for yield reducing shorts, current leakage, and reliability problems. Further yet, as device features continue to shrink to even smaller process technologies, even smaller misalignments may cause yield reducing problems.

Accordingly, in view of the foregoing, there is a need for a process for fabricating interconnect conductive contacts that do not introduce the aforementioned yield reducing and reliability problems associated with misalignments between successive fabricated semiconductor layers.

SUMMARY OF THE INVENTION

Broadly speaking, the present invention fills these needs by providing a process or fabricating a semiconductor device having interconnect conductive via contacts that self-align to an underlying metallization feature without introducing additional fabrication operations. It should be appreciated that the present invention can be implemented in numerous ways, including as a process, an apparatus, a system, a device, or a method. Several inventive embodiments of the present invention are described below.

In one embodiment, a process for making a self-aligning conductive via structure in a semiconductor device is disclosed. The process includes forming a first interconnect metallization layer over an oxide layer. Forming an etch stop layer over the first interconnect metallization layer. Forming a conductive via metallization layer over the etch stop layer. Forming a hard mask layer over the conductive via metallization layer. The process further includes producing a conductive via and an interconnect line, where the conductive via is formed from a portion of the conductive via metallization layer, and the interconnect line is formed from a portion of the first interconnect metallization layer. The conductive via is substantially aligned with the underlying interconnect line.

In another embodiment, an apparatus for making a self-aligning conductive via structure in a semiconductor device is disclosed. The apparatus includes means for forming a first interconnect metallization layer over an oxide layer. Means for forming an etch stop layer over the first interconnect metallization layer. Means for forming a conductive via metallization layer over the etch stop layer. Means for forming a hard mask layer over the conductive via metallization layer. The apparatus further includes producing a conductive via and an interconnect line, where the conductive via is formed from a portion of the conductive via metallization layer, and the interconnect line is formed from a portion of the first interconnect metallization layer. The conductive via is substantially aligned with the underlying interconnect line.

In yet another embodiment, a semiconductor structure having a substrate that includes at least one active device is disclosed. The semiconductor structure includes a first dielectric layer lying over the substrate. A first metal interconnect line being patterned over the surface of the first dielectric layer. An etch stop layer lying over the first metal interconnect line that is patterned over the surface of the first dielectric layer. The semiconductor structure further includes a discrete conductive via structure lying over the etch stop layer that is over the first metal interconnect line, the discrete conductive via structure being substantially aligned with the first metal interconnect line.

Advantageously, the conductive vias are self-aligning to the underlying interconnect lines, which avoids the overlapping problems presented by misalignments in the photolithography process. Most importantly, as feature sizes continue to shrink, the self-aligning aspect of the conductive vias will be well suited to increase circuit density and avoid short circuits in closely patterned interconnect lines. As such, the yield reducing shorts, current leakage, and reliability problem of prior art conductive via structures will no longer be an impediment to high density integrated circuit layouts. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

An invention for a process for fabricating a semiconductor device having interconnect conductive contacts that self-align to an underlying metallization feature is enclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
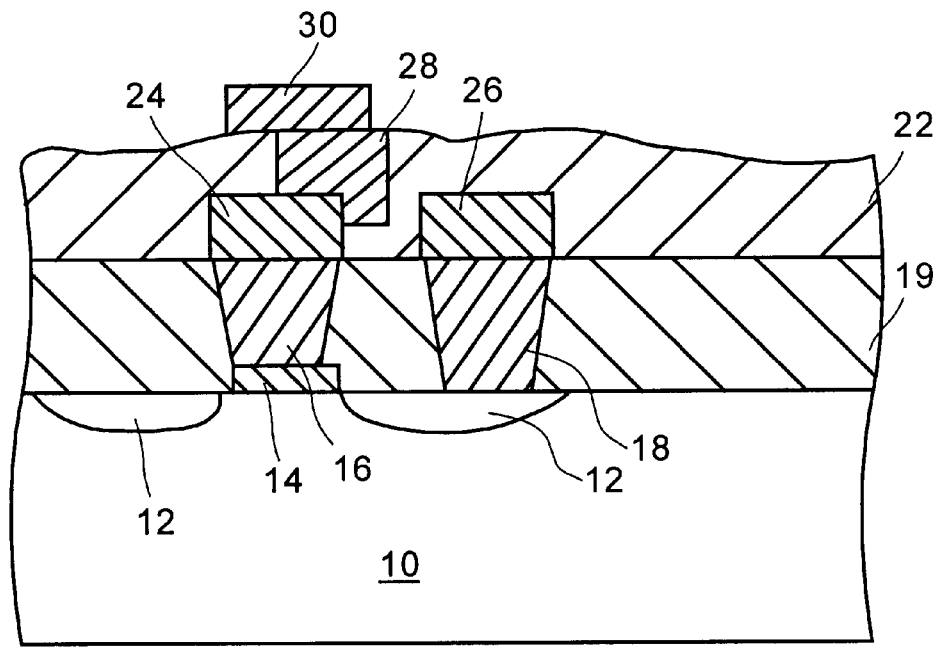
FIG. 1A is a cross sectional view of a conventional semiconductor device having a misaligned metal contact.
Figure 1B:
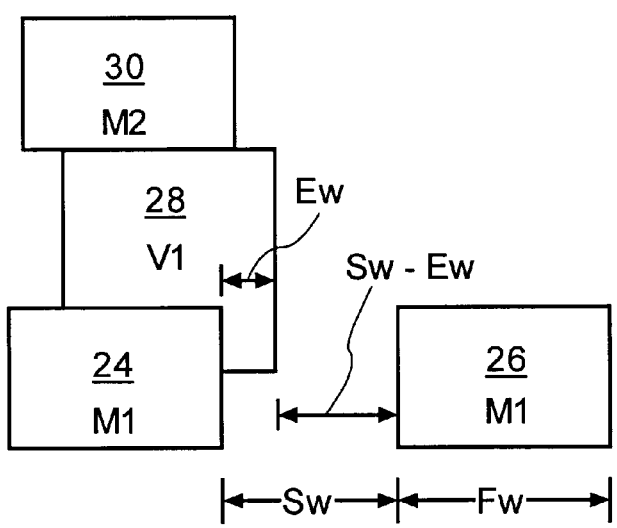
FIG. 1B is a block diagram illustrating the inter-feature violations caused when misalignments in conductive contacts occur.
Figure 1C:
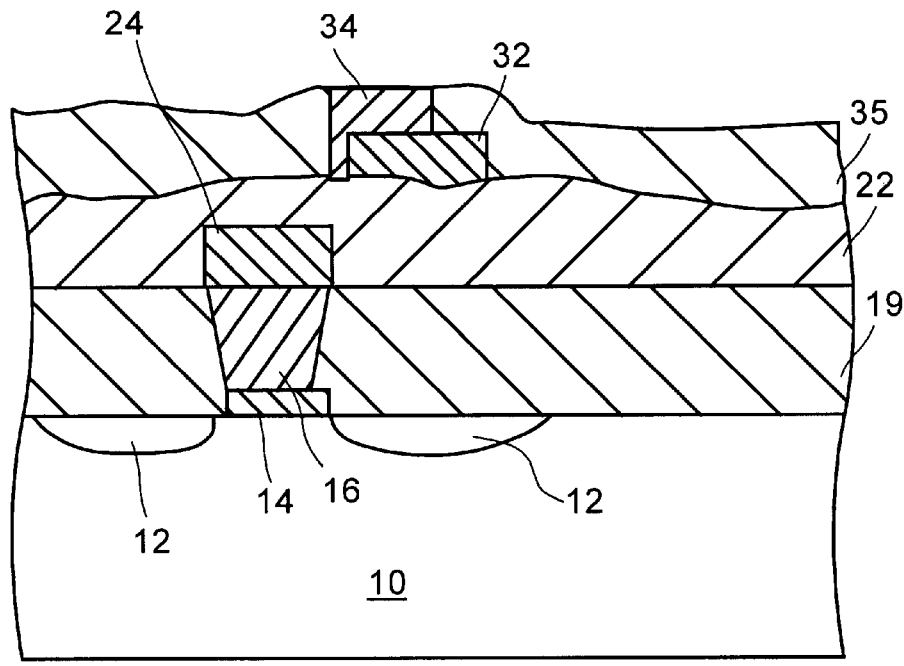
FIGS. 1C and 1D illustrate another problem experienced by misalignments in conductive contacts.
Figure 1D:
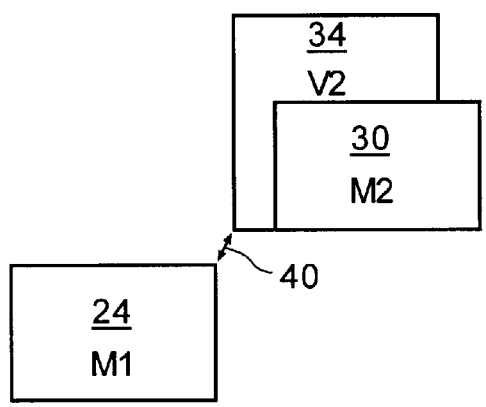
Figure 2:
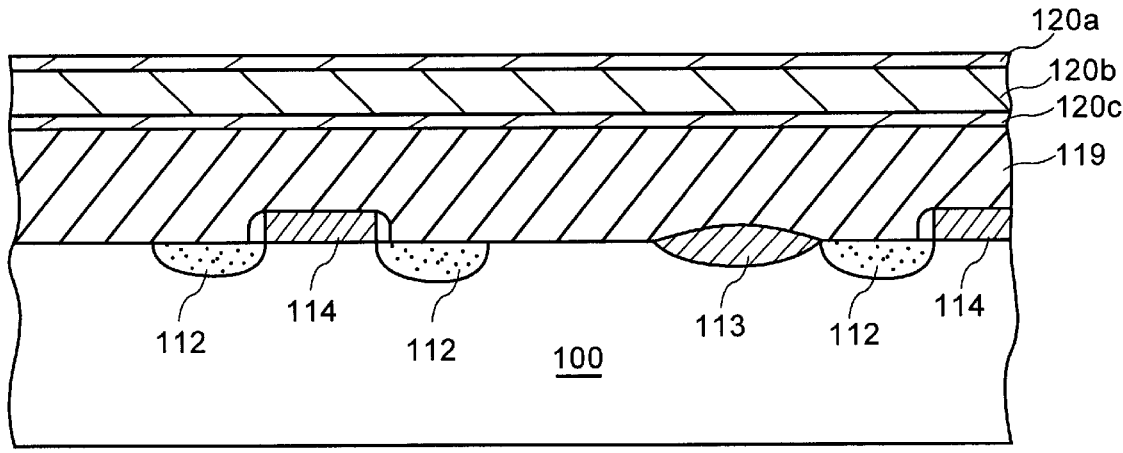
FIG. 2 is a cross sectional view of a semiconductor substrate having a number of active devices and fabricated layers in accordance with one embodiment of the present invention.

FIG. 2 is a cross sectional view of a semiconductor substrate 100 having a number of active devices and fabricated layers in accordance with one embodiment of the present invention. As shown, the semiconductor substrate 100 has diffusion regions 112 formed into the semiconductor substrate 100 and associated polysilicon gates 114. Also shown is a field oxide 113 typically implemented to separate adjacent active devices in a semiconductor design. A first dielectric layer 119 is deposited over portions of the semiconductor substrate 100, diffusion regions 112, polysilicon gates 114, and field oxide 113. Generally, first dielectric layer 119 may be any commonly used dielectric, such as a deposited silicon dioxide ($SiO_2$) layer that is subsequently planarized to provide a substantially even top surface for subsequently deposited layers. By way of example, the first dielectric layer 119 may be planarized using a chemical mechanical polishing (CMP) technique, or any other suitable technique suitable to provide a substantially planer top surface.

Once planarized, a bottom barrier layer 120c is deposited over the first dielectric layer 119 to a preferred thickness of between about 100 angstroms and about 800 angstroms. More preferably, the bottom barrier layer 120c is deposited to a thickness of between about 150 angstroms and 500 angstroms, and most preferably to a thickness of about 200 angstroms. In this embodiment, the bottom barrier layer 120c is a titanium nitride (TiN) layer evenly deposited over the top surface of the first dielectric layer 119. Of course, other suitable barrier layers may be used as well, such as titanium (Ti), or a titanium/titanium nitride (Ti/TiN) combination.

Once the bottom barrier layer 120c has been deposited, an interconnect metallization layer 120b, which is preferably an aluminum/copper (Al/Cu) mixture containing about 99.5% aluminum and about 0.5% copper is deposited over the bottom barrier layer 120c. The interconnect metallization layer 120b is preferably deposited to a thickness of between about 3,000 angstroms and about 10,000 angstroms, and more preferably between about 4,000 angstroms and 7,000 angstroms, and most preferably about 5,000 angstroms. Next, a top barrier layer 120a, which is preferably titanium nitride (TiN) having a thickness of between about 100 angstroms and 800 angstroms, and more preferably between about 150 angstroms and 600 angstroms, and more preferably about 300 angstroms is applied over the interconnect metallization layer 120b. The top barrier layer 120a may also be a combination of titanium and titanium nitride (Ti/TiN). Further, the top barrier layer 120a is a good anti-reflective layer (ARC) material that assists in improving photolithography patterning precision. As will be described below, layers 120a, 120b, and 120c will be subsequently patterned to form a first level of metallization interconnect lines, that may be used to interconnect devices formed in semiconductor substrate 100. Accordingly, conductive vias down to the polysilicon gates 114 and diffusion regions 112 are not shown for ease of description.

Figure 3:
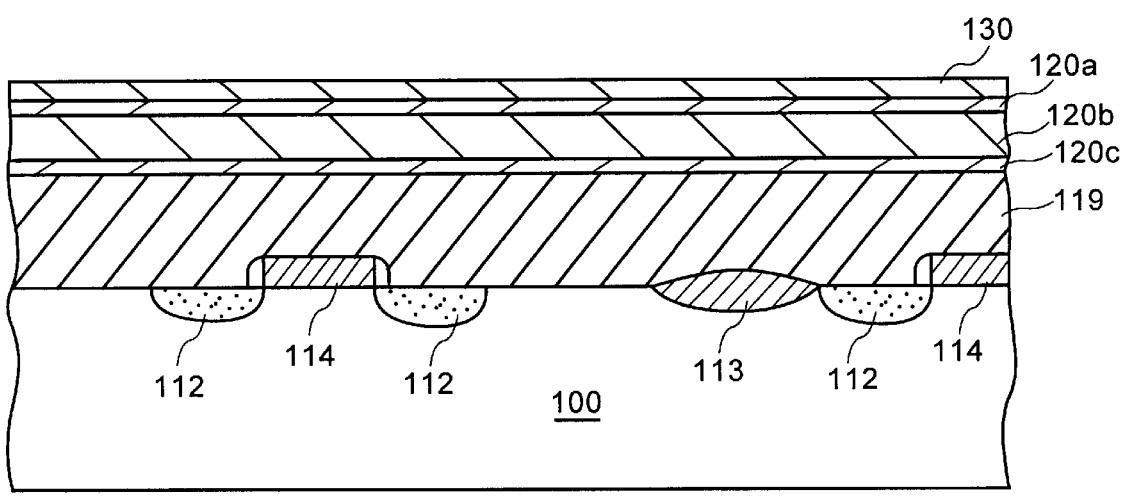
FIG. 3 shows the cross sectional view of FIG. 2 after an etch stop layer is deposited over a top barrier layer in accordance with one embodiment of the present invention.

FIG. 3 shows the cross sectional view of FIG. 2 after an etch stop layer 130 is deposited over the top barrier layer 120a in accordance with one embodiment of the present invention. Etch stop layer 130 is preferably a titanium tungsten (TiW) layer having a thickness of between about 200 angstroms and 1,000 angstroms, and more preferably between about 300 angstroms and about 800 angstroms, and most preferably about 600 angstroms. In another embodiment, the etch stop layer 130 may also be a tungsten (W) layer or a tungsten silicide ($WSi_2$) layer suitable for stopping a $Cl_2/BCL_3$ etch chemistry, which will be described in greater detail below with reference to FIG. 5B and table A.

Figure 4:
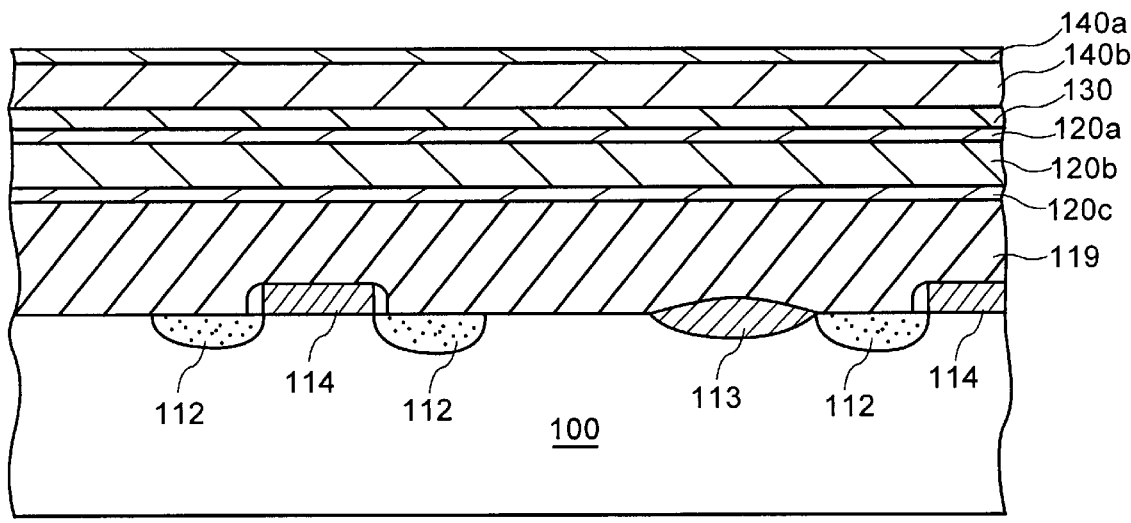
FIG. 4 shows the cross sectional view of FIG. 3 after a conductive via metallization layer and an anti-reflective layer have been successively deposited over the etch stop layer in accordance with one embodiment of the present invention.

FIG. 4 shows the cross sectional view of FIG. 3 after a conductive via metallization layer 140b and a top barrier layer 140a have been successively deposited over the etch stop layer 130. Preferably, conductive via metallization layer 140b is an aluminum/copper (Al/Cu) mixture similar to that of interconnect metallization layer 120b described above. Preferably, conductive via metallization layer 140b is deposited to a thickness of between about 3,000 angstroms and about 10,000 angstroms, and more preferably between about 4,000 angstroms and 7,000 angstroms, and most preferably about 5,000 angstroms.

Once conductive via metallization layer 140b has been deposited to an appropriate thickness, the top barrier layer 140a, being a titanium nitride (TiN) layer is deposited to a thickness of between about 100 angstroms and about 800 angstroms, and most preferably between about 150 angstroms and about 600 angstroms, and most preferably about 300 angstroms. In this embodiment, top barrier layer 140a is similar to that of top barrier layer 120a, which may also be a combination of titanium and titanium nitride (Ti/TiN). As mentioned above, the top barrier layer 140a is a good anti-reflective layer (ARC) material that assists in improving photolithography patterning operations. As will be shown below, conductive via metallization layer 140b and top barrier layer 140a will be subsequently patterned to define self-aligning conductive vias which are preferably used to electrically interconnect to the patterned interconnect lines formed from the first metallization layers 120a, 120b, and 120c.

Figure 5A:
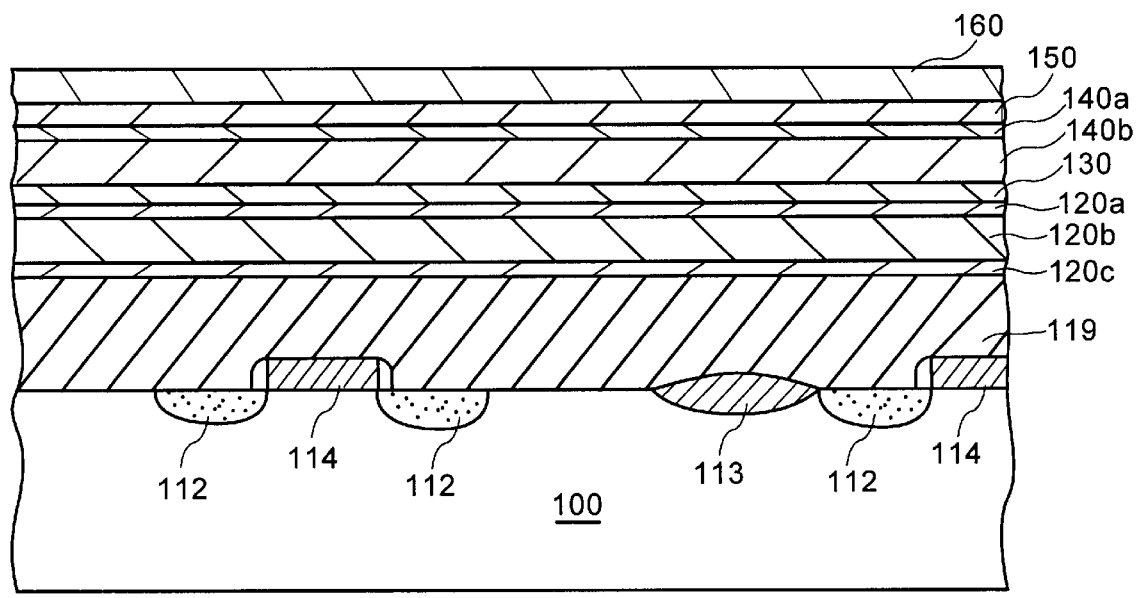
FIG. 5A shows the cross sectional view of FIG. 4 after a hard mask layer and photoresist layer have been successively deposited over the anti-reflective layer in accordance with one embodiment of the present invention.

FIG. 5A shows the cross sectional view of FIG. 4 after a hard mask layer 150, which is preferably a silicon nitride (SiN) layer, is deposited over the top barrier layer 140a in accordance with one embodiment of the present invention. Preferably, the hard mask is deposited to a thickness of between about 500 angstroms and about 2,000 angstroms, and more preferably between about 700 angstroms and about 1,500 angstroms, and most preferably about 1,000 angstroms. In one embodiment, hard mask layer 150 will be subsequently used for patterning the resulting conductive vias formed from patterning conductive via metallization layer 140b and top barrier layer 140a as shown in FIG. 5J below. Other suitable materials for hard mask layer 150 may be a silicon dioxide ($SiO_2$) layer or a silicon oxy nitride (SiON) layer deposited to about the same thickness as the silicon nitride (SiN) layer.

After the hard mask layer 150 has been deposited, a photoresist layer 160 is spin coated over the top surface of hard mask layer 150. In one embodiment, the photoresist layer 160 is applied to a thickness of between about 3,000 angstroms and about 15,000 angstroms, and more preferably between about 4,000 angstroms and about 9,000 angstroms, and most preferably about 5,000 angstroms. In general, the photoresist thickness is selected such that some photoresist remains over the hard mask 150 as shown in FIG. 5C.

Figure 5B:
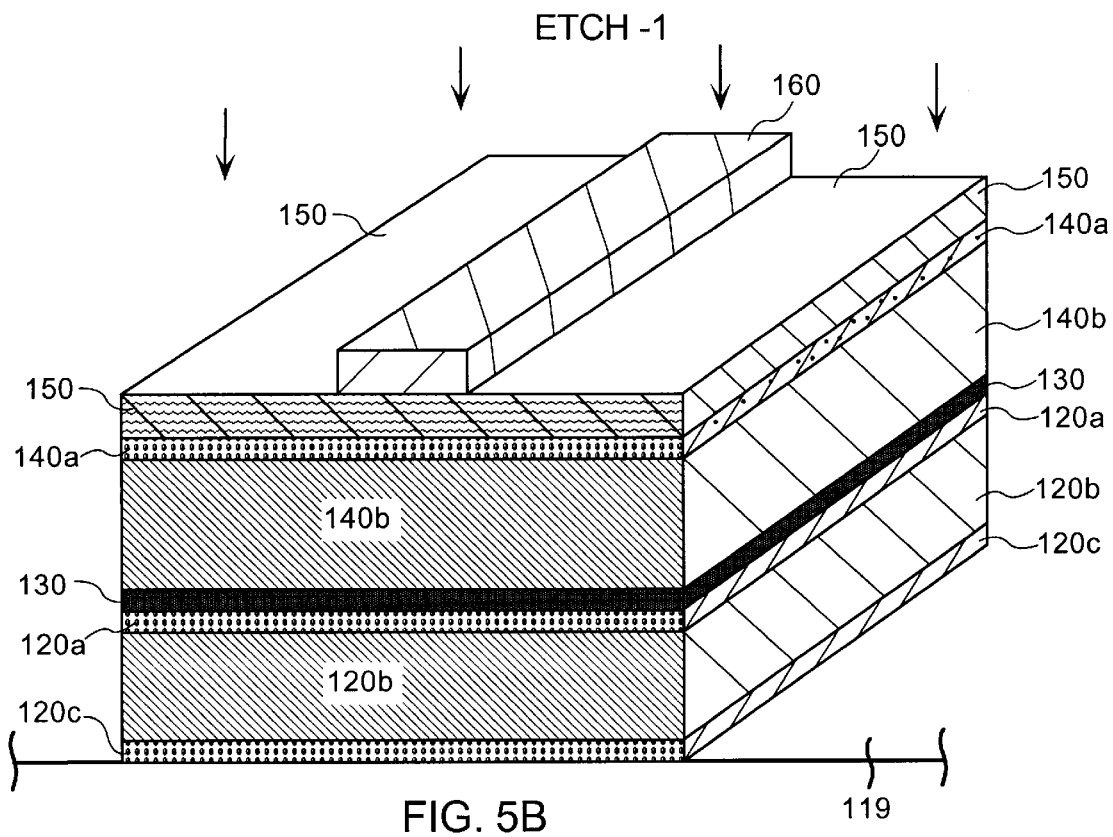
FIG. 5B is a three dimensional view of the top most layers deposited over the first dielectric layer in accordance with one embodiment of the present invention.

FIG. 5B is a three dimensional view of the top most layers deposited over the first dielectric layer 119 in accordance with one embodiment of the present invention. For ease of understanding, only the top most layers will be shown in FIGS. 5B through 5K to illustrate the advantageous self-aligning features of conductive vias formed over a lower metallization line. At this point, photoresist layer 160 has been patterned using conventional photolithography techniques to define an outline of the desired metallization interconnect line feature geometries patterned from layers 120a, 120b, and 120c (e.g., as shown in FIG. 5K below). Once photoresist layer 160 is patterned as shown, the semiconductor wafer is subjected to two etching operations (Etch-1). The first etching operation takes advantage of an $O_2/CHF_3$ chemistry (described in table C below), which is well suited for etching through exposed regions of hard mask 150 layer. Once the hard mask layer 150 etch is complete, a second $Cl_2/BCL_3$ etch chemistry (described in table A below) is used to etch through the top barrier layer 140a and conductive via metallization layer 140b. However, as mentioned above, etch stop layer 130 is preferably well suited to stop the etching chemicals from removing any more material once the conductive via metallization layer 140b is removed.

Figure 5C:
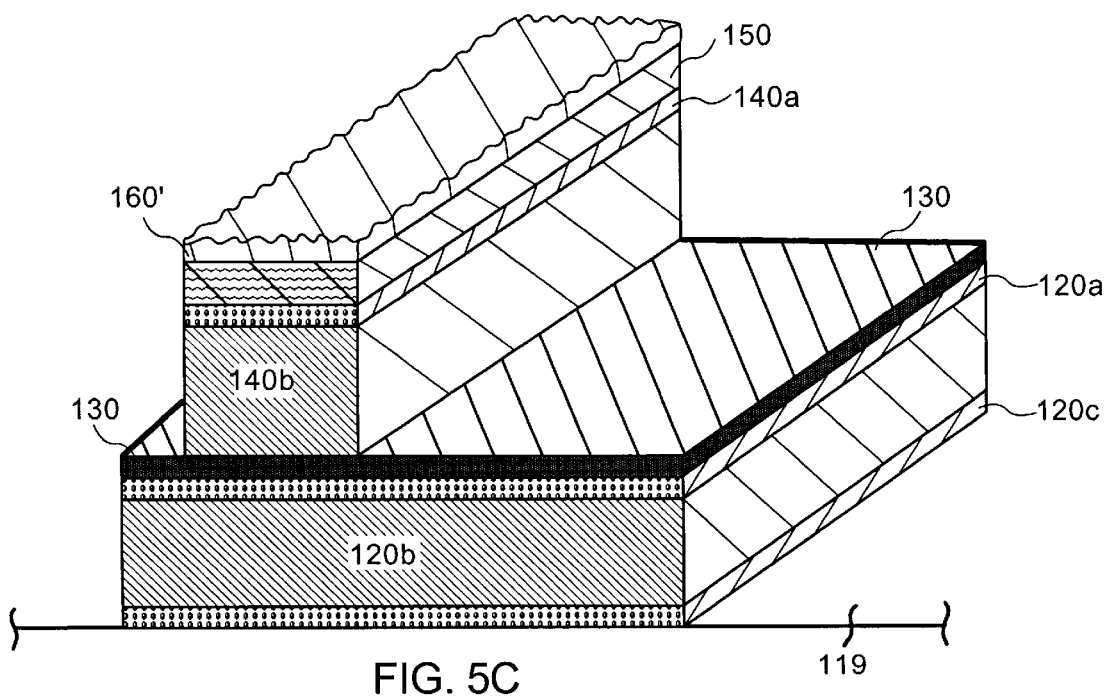
FIG. 5C shows the resulting structure after etching operations are performed in FIG. 5B in accordance with one embodiment of the present invention.

FIG. 5C shows the resulting structure after the etching operations of Etch-1 are performed in FIG. 5B in accordance with one embodiment of the present invention. This perspective therefore illustrates that the conductive via metallization layer 140b and top barrier layer 140a are completely removed in those regions where the patterned photoresist layer 160 was not protecting the underlying surface. After the Etch-1 process, a photoresist layer 160' will remain having a thickness of between about 1,000 angstroms and about 2,500 angstroms, and most preferably about 2,000 angstroms. Most importantly, the etch chemistries used to etch through hard mask layer 150, top barrier layer 140a and conductive via metallization layer 140b do not substantially penetrate etch stop layer 130 because the second $Cl_2/BCL_3$ etch chemistry does not etch titanium tungsten (TiW), tungsten (W), or tungsten silicide ($WSi_2$) well.

Figure 5D:
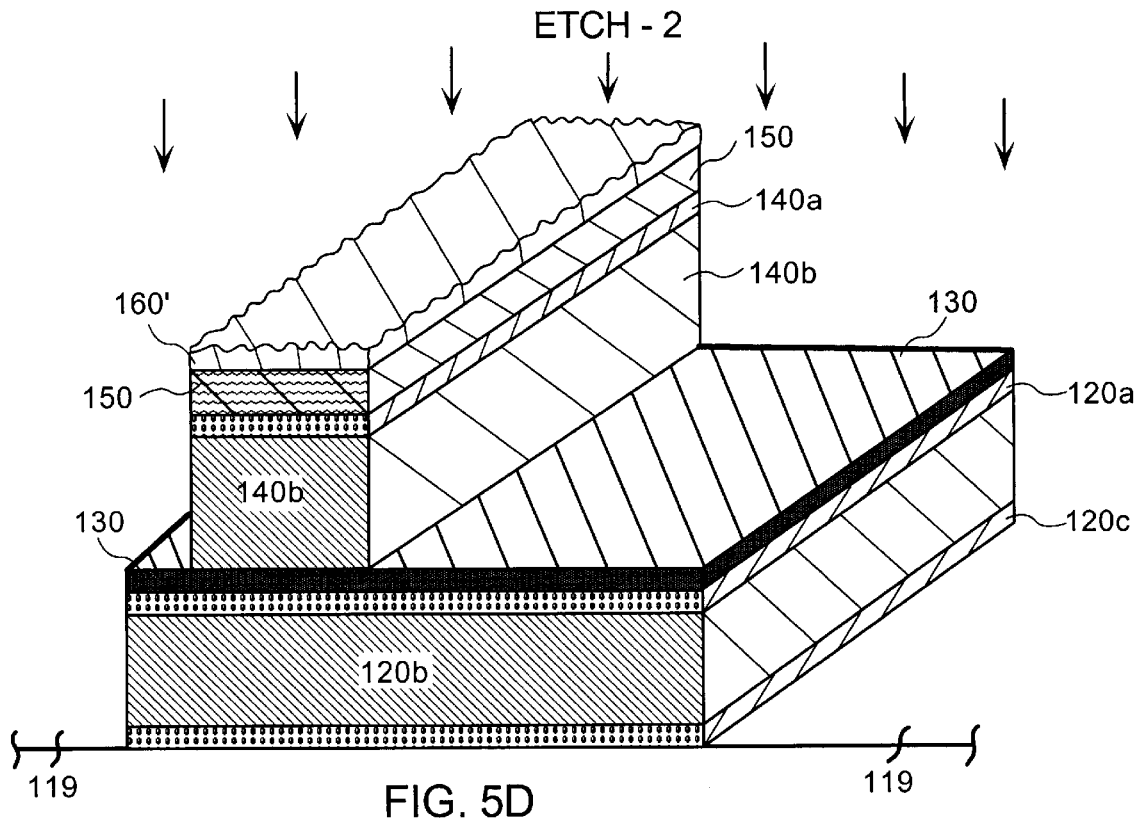
FIG. 5D illustrates another etching operation used to remove a portion of the etch stop layer in accordance with one embodiment of the present invention.

FIG. 5D illustrates another etching (Etch-2) operation used to remove the etch stop layer 130 in accordance with one embodiment of the present invention. Preferably, a $BCl_3/SF_6$ chemistry described in table B below is used to remove etch stop layer 130. Once Etch-2 removes the etch stop layer 130 over regions not protected by the patterned photoresist 160' and hard mask 150, the top barrier layer 120a will be exposed. During Etch-2, most of the patterned photoresist 160' will be substantially removed, but the underlying hard mask 150 will also assist in protecting the top barrier layer 140a and the conductive via metallization layer 140b. However, to ensure that no photoresist 160' remains, a conventional resist stripping operation is performed before proceeding to the next operation.

Figure 5E:
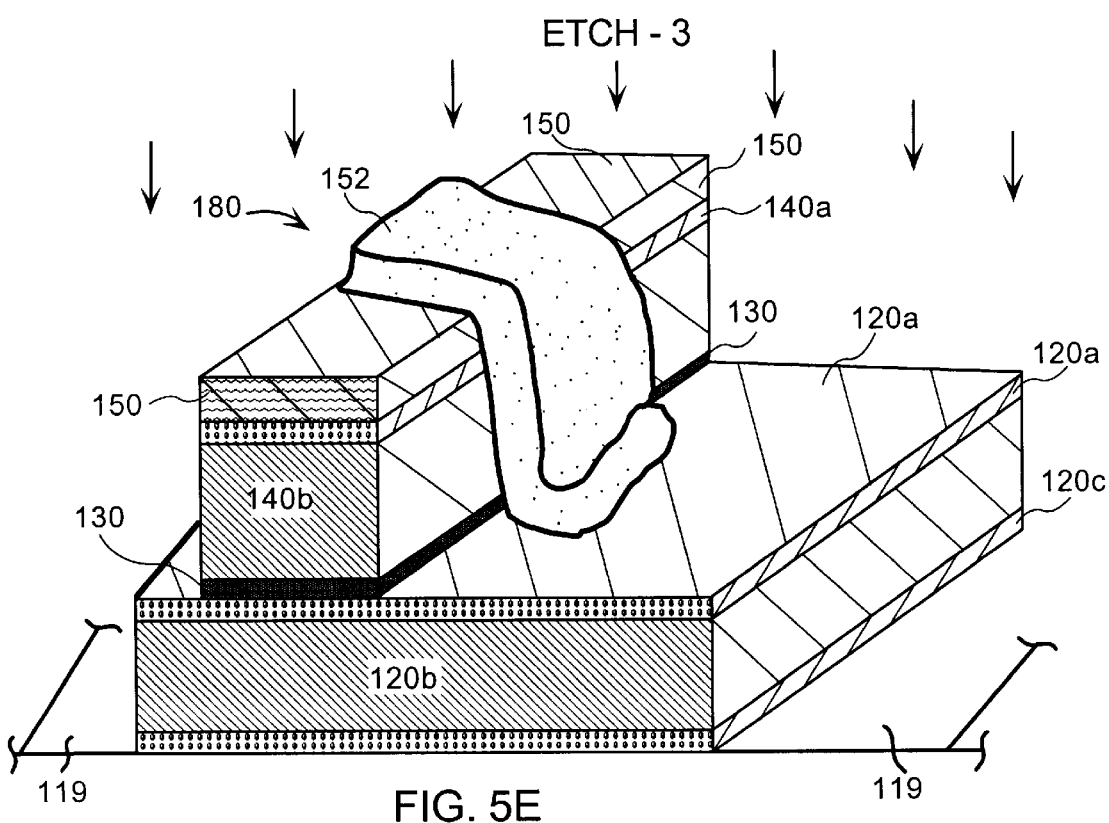
FIG. 5E shows a via photoresist mask pattern formed over the remaining hard mask layer and another etching operation in accordance with one embodiment of the present invention.
Figure 6A:
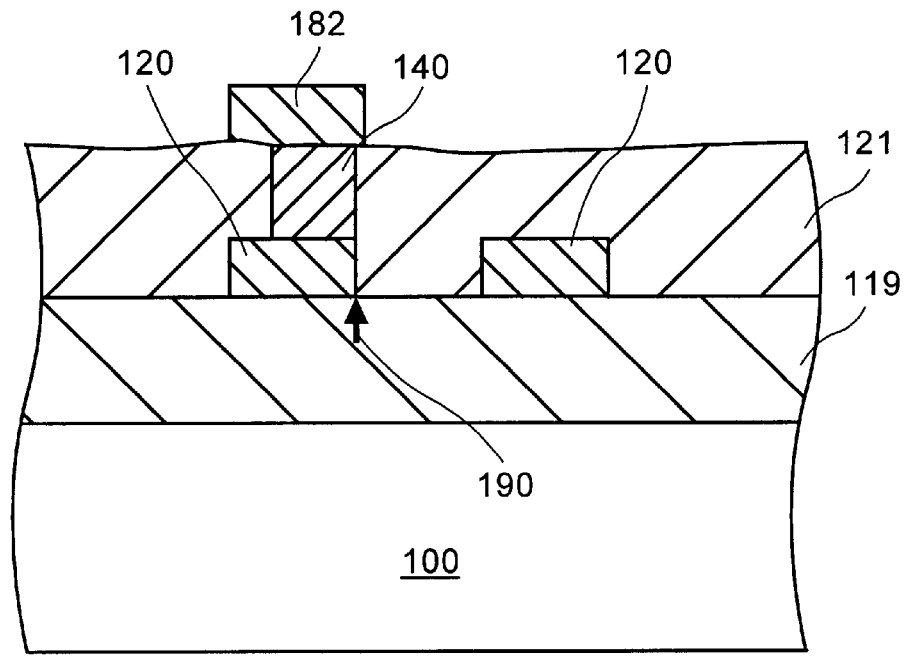
FIGS. 6A through 6D are exemplary cross sectional views of the aligning of the conductive via structures used to interconnect two metallization levels in accordance with one embodiment of the present invention.

FIG. 5E shows a photoresist mask pattern 152 formed over hard mask layer 150 and another etching operation (Etch-3) in accordance with one embodiment of the present invention. Photoresist mask pattern 152 is preferably patterned over a portion of hard mask 150 to protect selected regions of hard mask 150 from the Etch-3 operation, which is used to define the location of self-aligned conductive vias. Specifically, the resulting conductive vias (i.e., formed form conductive via metallization layer 140b and top barrier layer 140a) will lie under the photoresist mask pattern 152. As shown, the photoresist mask experienced a slight misalignment (i.e., shift to the right). These misalignments are common, and are becoming ever more severe with the need to pattern increasingly smaller features within very tight tolerances. As such, a part of the photoresist mask 152 will be applied over parts of top barrier layer 120a and the side wall of conductive via metallization layer 140b and top barrier layer 140a. Therefore, part of the hard mask 150 on the left side will be unprotected, thereby causing the formation of thinner conductive via structure as illustrated in FIG. 6A below. Once patterned with the photoresist, the Etch-3 is preferably used to remove regions of hard mask 150 that are uncovered with the photoresist mask pattern 152. As such, Etch-3 implements the aforementioned $O_2/CHF_3$ chemistry described in table C below.

Figure 5F:
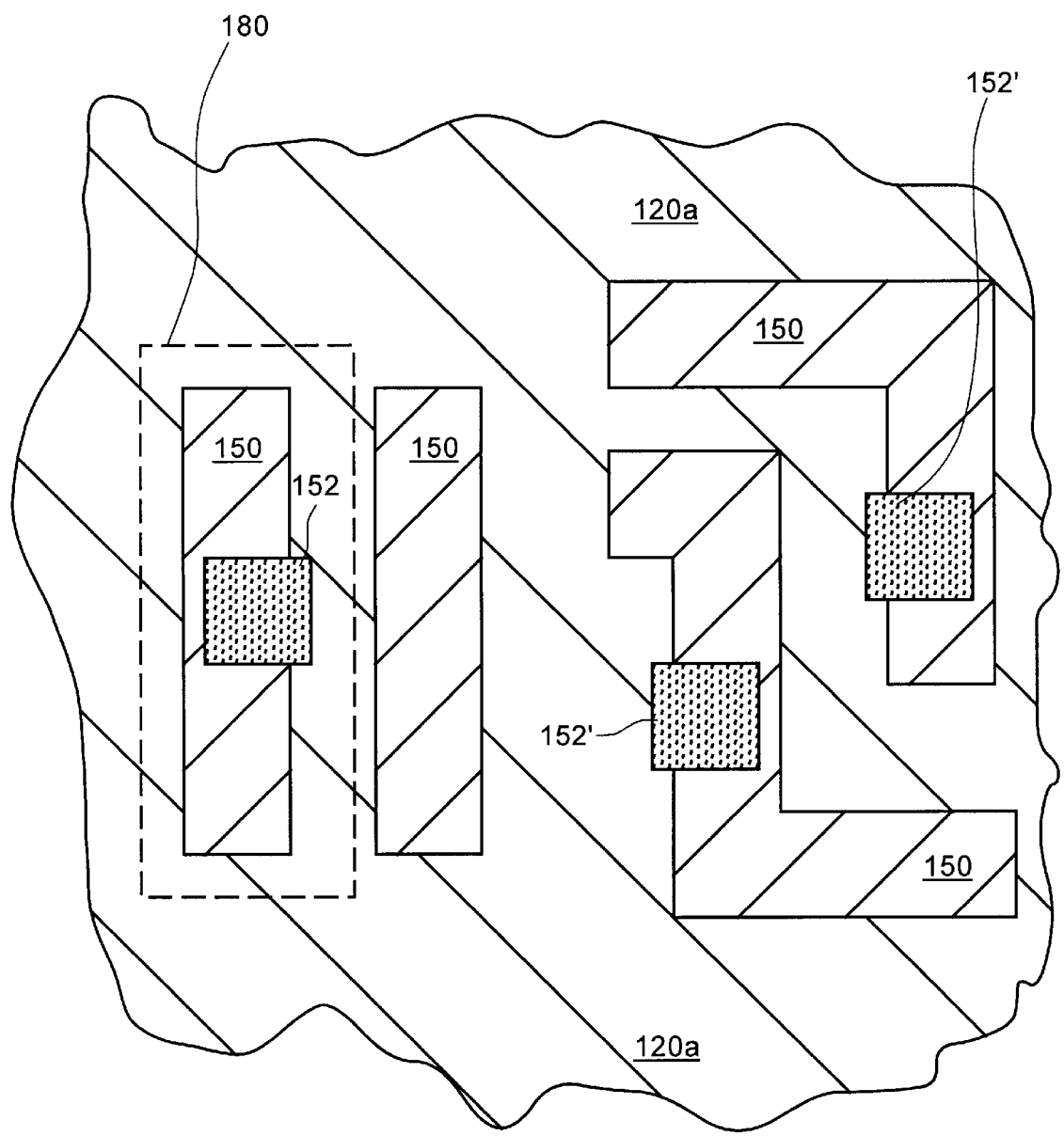
FIGS. 5F through 5I are top views illustrating other representative interconnect patterns that may be defined throughout a surface of a semiconductor device and associated via photoresist mask patterns in accordance with one embodiment of the present invention.

FIG. 5F is a top view illustrating other representative patterns (i.e., interconnect lines) that may be defined throughout a surface of a semiconductor device. In this example, a region 180 illustrates the exemplary photoresist pattern 152 defined over hard mask layer 150, and a portion of top barrier layer 120a. Also shown are other regions where conductive vias will ultimately reside under the photoresist mask patterns 152'. Because the resulting via structures of the present invention are self-aligned, and will not be defined outside of the contours (i.e., outline) of the underlying hard mask layer 150 (i.e., as shown in FIG. 5K), the leakage currents and short circuit problems of the prior art will no longer be present.

Figure 5G:
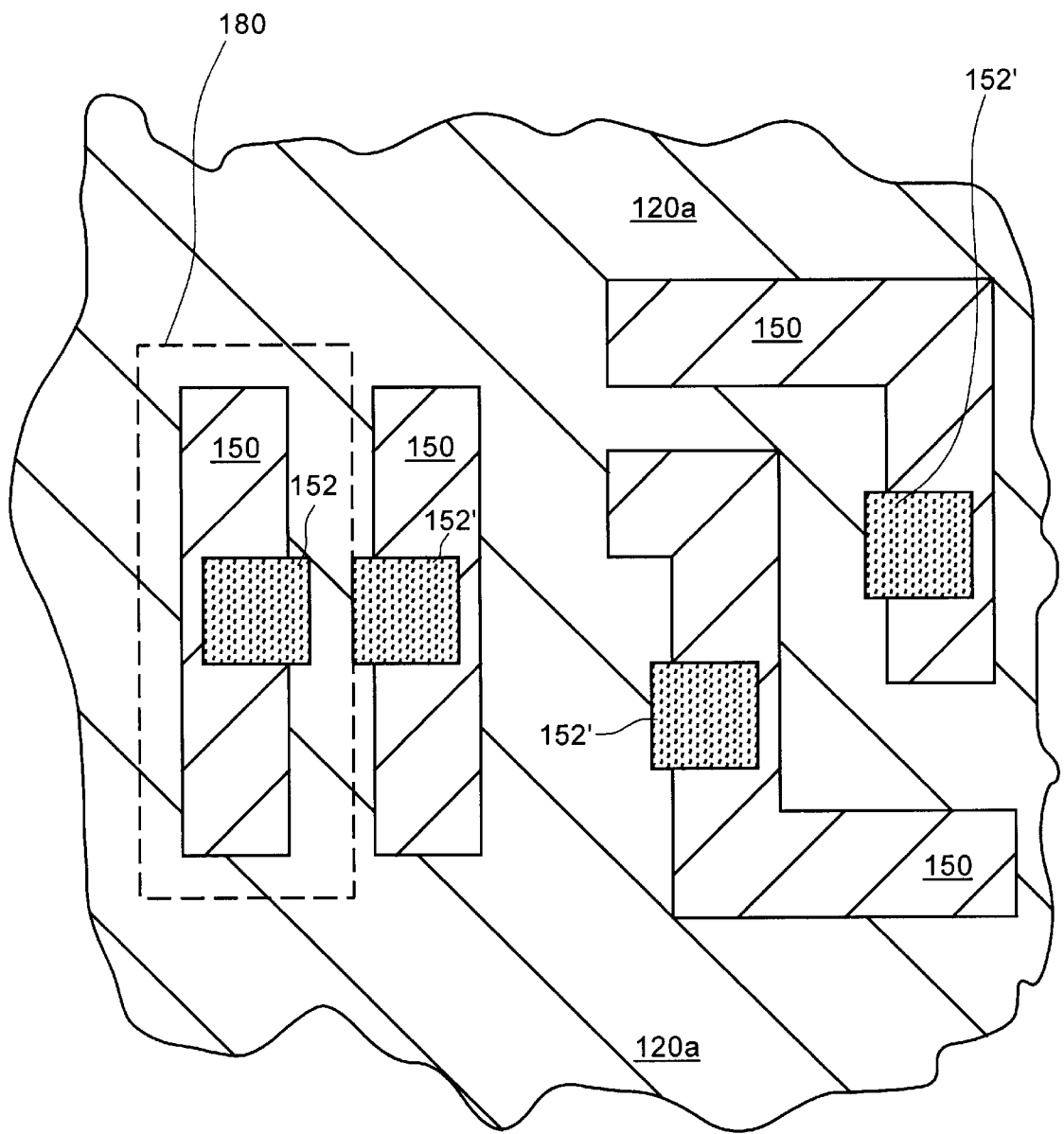
Figure 6B:
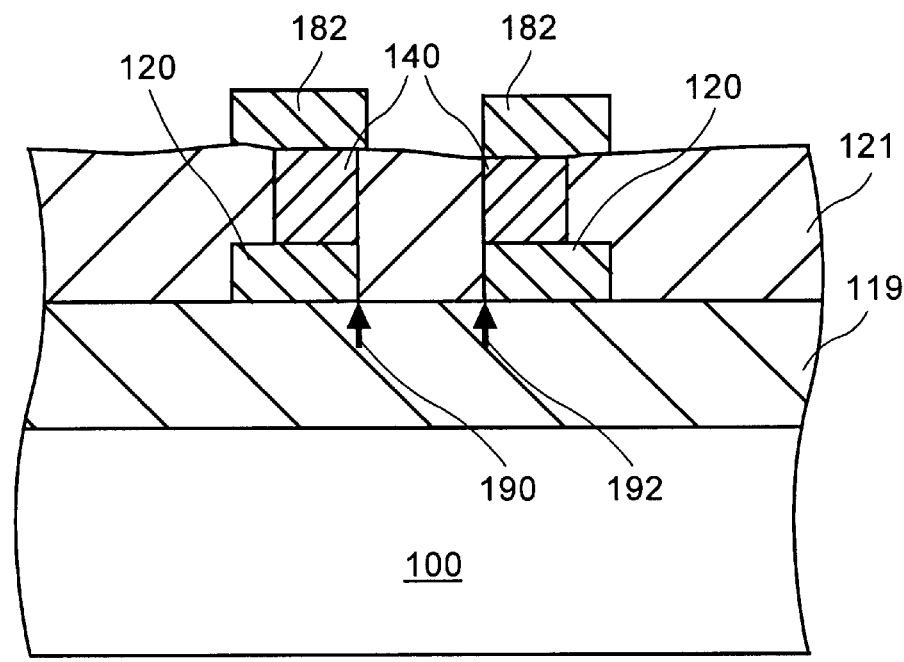

FIG. 5G is the top view of FIG. 5F showing a photoresist pattern 152' defined next to the photoresist pattern 152 on an adjacent interconnect line. As shown in FIG. 6B below, even when adjacent conductive vias are designed in close proximity to each other, and the photoresist patterns nearly meet, the resulting conductive vias 140 will still be perfectly aligned with the underlying interconnect lines 120.

Figure 5H:
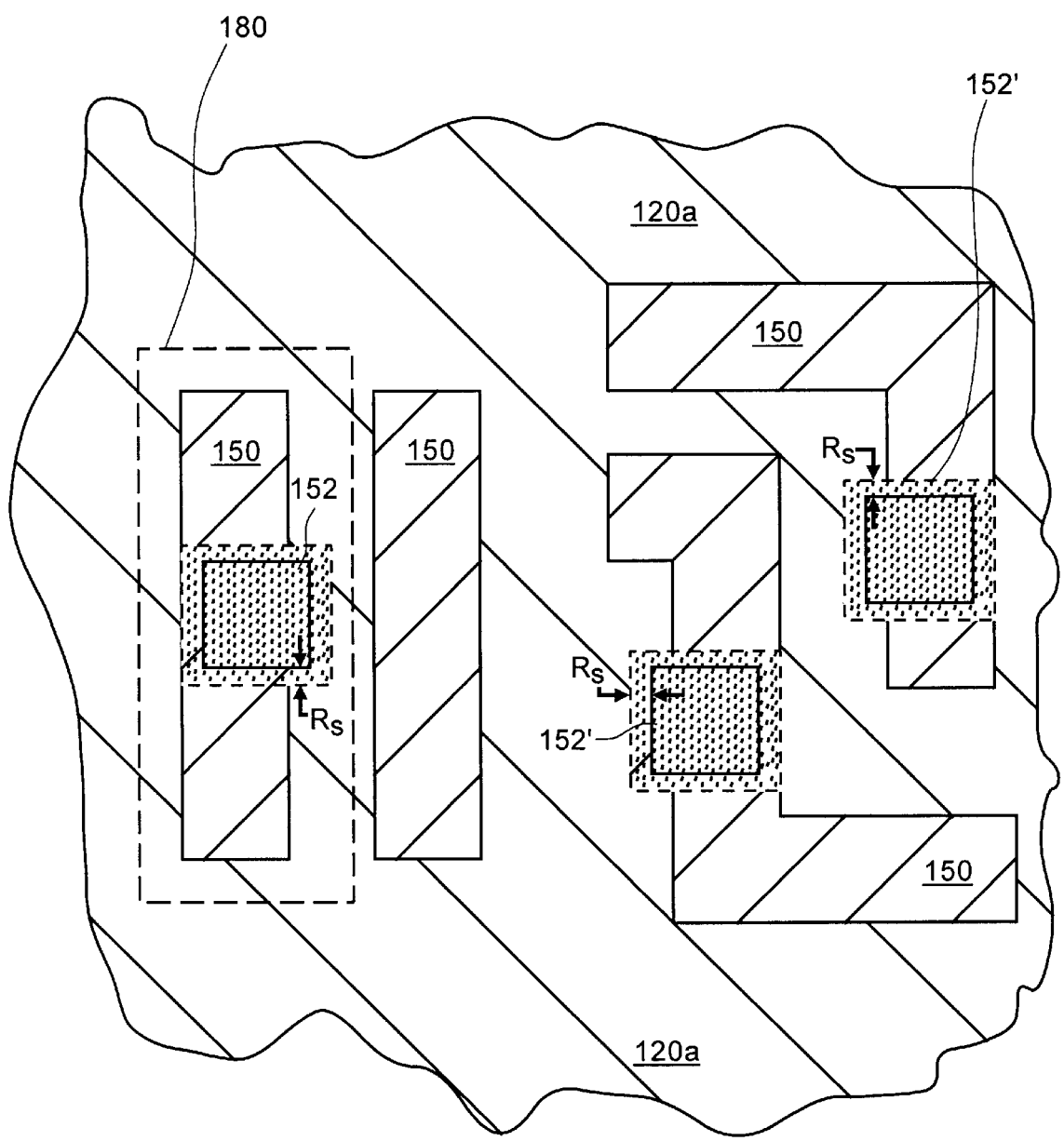

In another embodiment, to avoid producing thinner vias caused by misalignments, the designer may simply implement a re-sizing of the reticle patterns used to define photoresist mask patterns 152 and 152'. As shown in FIG. 5H, a re-size (Rs) is implemented to increase the size of the reticle mask used to pattern the photoresist layer, and to define a photoresist mask 152 and 152' that has a larger shape. In this manner, the resulting photoresist mask pattern 152 shown in FIG. 5E may completely cover the top surface of hard mask layer 150, where the resulting conductive via will reside after and Etch-4 is performed in FIG. 5J below.

Figure 5I:
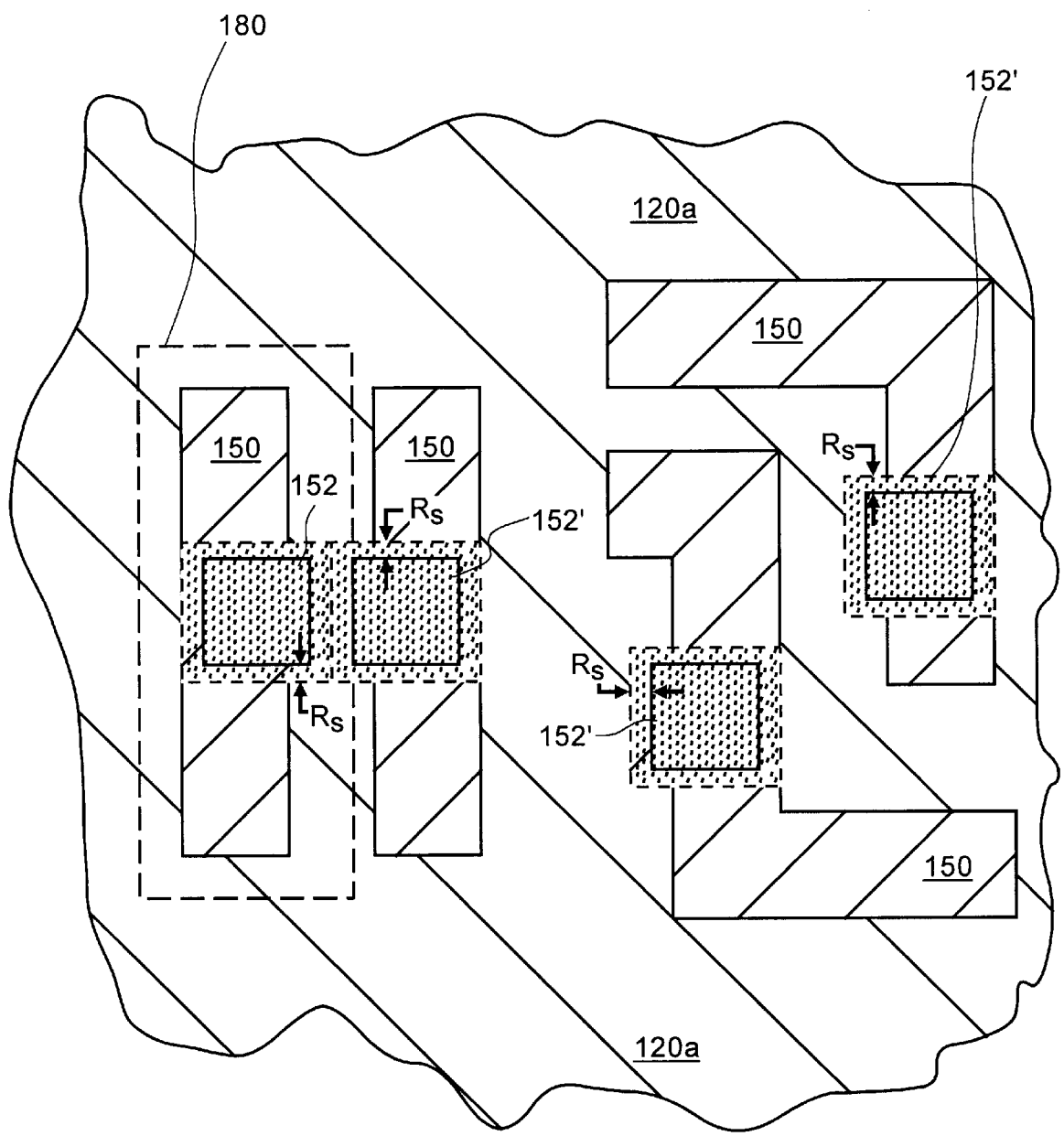
Figure 5J:
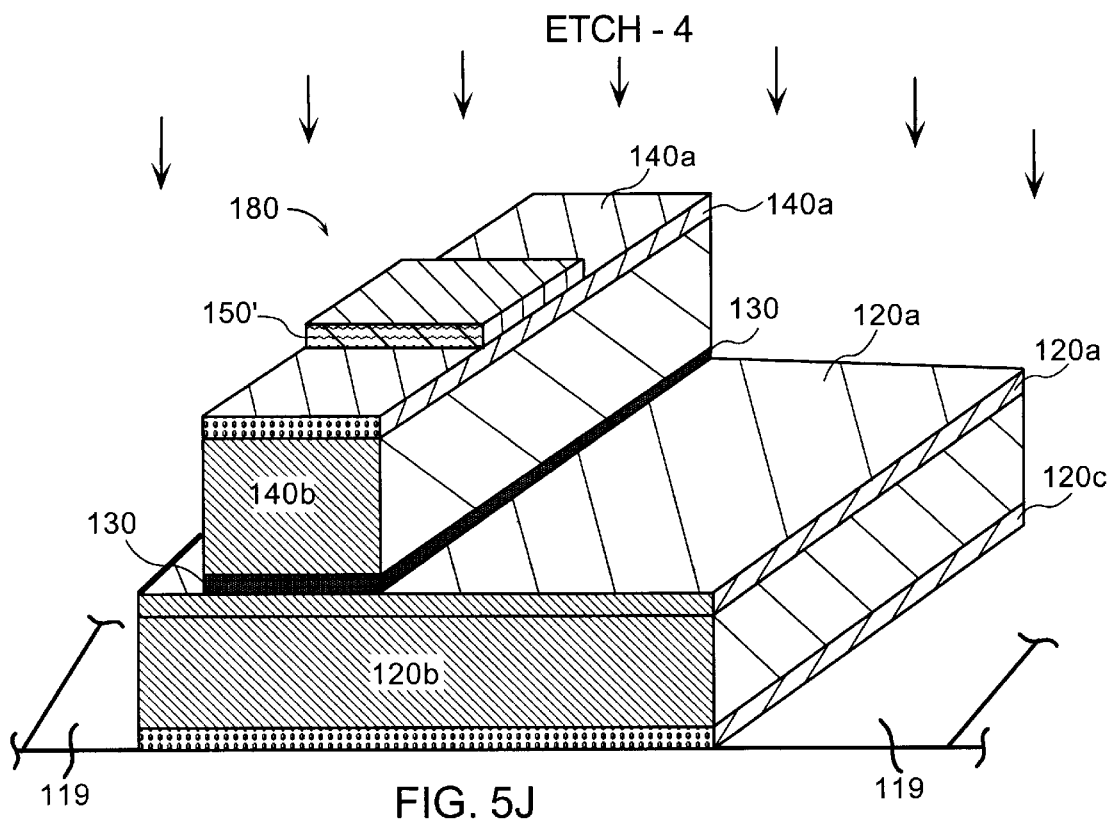
FIG. 5J illustrates the remaining hard mask pattern used to define the location of the conductive via structures in accordance with one embodiment of the present invention.
Figure 5K:
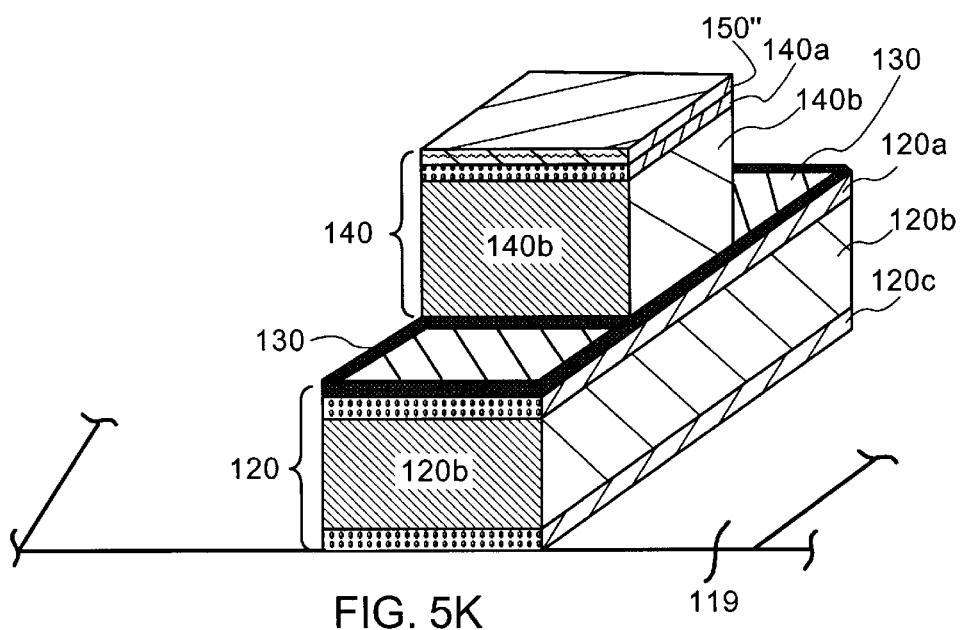
FIG. 5K illustrates the resulting interconnect line and aligned conductive via structure formed over the interconnect line in accordance with one embodiment of the present invention.

FIG. 5I is the top view of FIG. 5G after a re-sizing is performed to increase the size of the photoresist patterns 152 and 152'. However, because there are two adjacently positioned photoresist patterns 152 and 152' on adjacent interconnect lines, the photoresist material will tend to merge. In prior art designs, when the via masks merged due to misalignments, the conductive vias would necessarily be formed as one large conductive via that would produce an erroneous electrical interconnection (i.e., the two adjacent interconnect lines would be accidentally shorted together). It is therefore important to realize that even if the photoresist patterns 152 and 152' merge as shown in FIG. 5I, the resulting vias will still be spaced apart and perfectly aligned as shown in FIG. 6D below.

In FIG. 5J, once the photoresist material is stripped off, a hard mask pattern 150' will remain over top barrier layer 140a, thereby defining a region underlying the hard mask pattern 150', where a resulting conductive via 140 will reside as shown in FIG. 5K. Accordingly, during the Etch-4 operation, all regions not covered by hard mask pattern 150' and etch stop layer 130 will be removed, thereby defining a conductive interconnect line 120 and a conductive via 140. That is, Etch-4 is preferably a $Cl_2/BCl_3$ chemistry (described in table A below) that is well suited to etch through conductive via metallization layer 140b and top barrier layer 140a down to the etch stop layer 130, and through top barrier layer 120a, interconnect metallization layer 120b, and bottom barrier layer 120c down to the fist dielectric layer 119. As a result, FIG. 5K shows a resulting conductive interconnect line 120 having an overlying conductive via 140 that is perfectly self-aligned with the underlying conductive interconnect line 120. It should be appreciated that no via overlapping is experienced past the edge of conductive interconnect line 120 as in prior art FIGS. 1A–1D.

FIG. 6A is a cross sectional view of a semiconductor substrate 100 having a first dielectric layer 119 and a perfectly aligned conductive via 140 lying between conductive interconnect line 120 and a top conductive interconnect line 182. In this example, the conductive via 140 is perfectly aligned to a right edge 190 of the underlying conductive interconnect line 120, however, the conductive via is thinner because the photoresist mask pattern 152 was misaligned. When misalignments occur, the conductive via 120 will still work well, but will have a higher resistance. It is most important to note that the conductive via 120 will not overlie beyond the boundary outline of the underlying conductive interconnect line 120 (even if there are misalignments), which advantageously avoids shorts and leakage currents.

FIG. 6B shows the semiconductor device of FIG. 6A when a conductive via is formed on an adjacent line as shown in FIG. 5G. As shown, even though the photoresist patterns 152 and 152' were misaligned, the resulting conductive vias 140 will still be aligned to the underlying interconnect lines 120. As such, the left edge 192 of the conductive via 140 formed over the adjacent interconnect line will still be aligned to the photoresist mask patterns 152 and 152'.

Figure 6C:
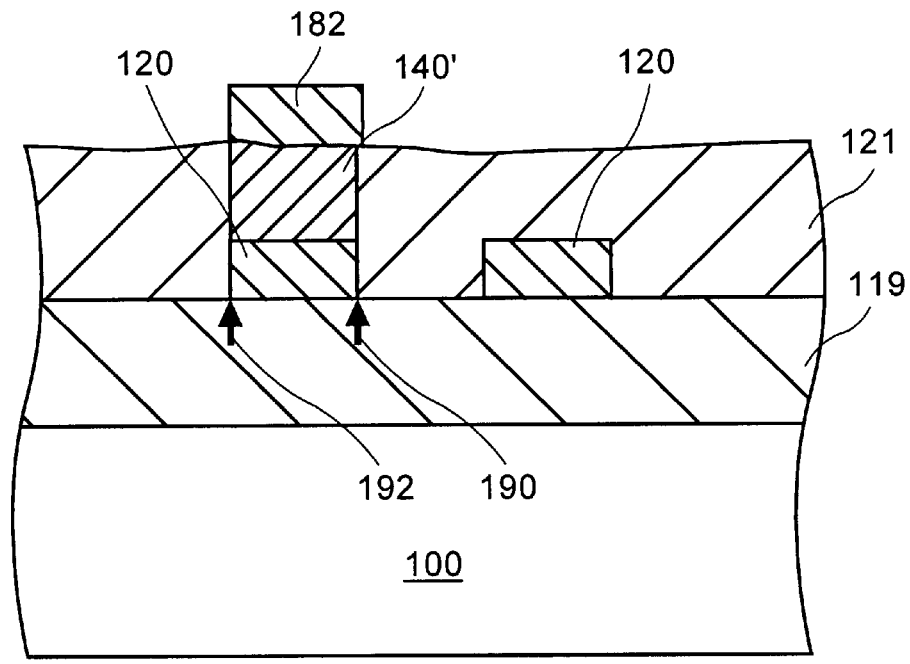
Figure 6D:
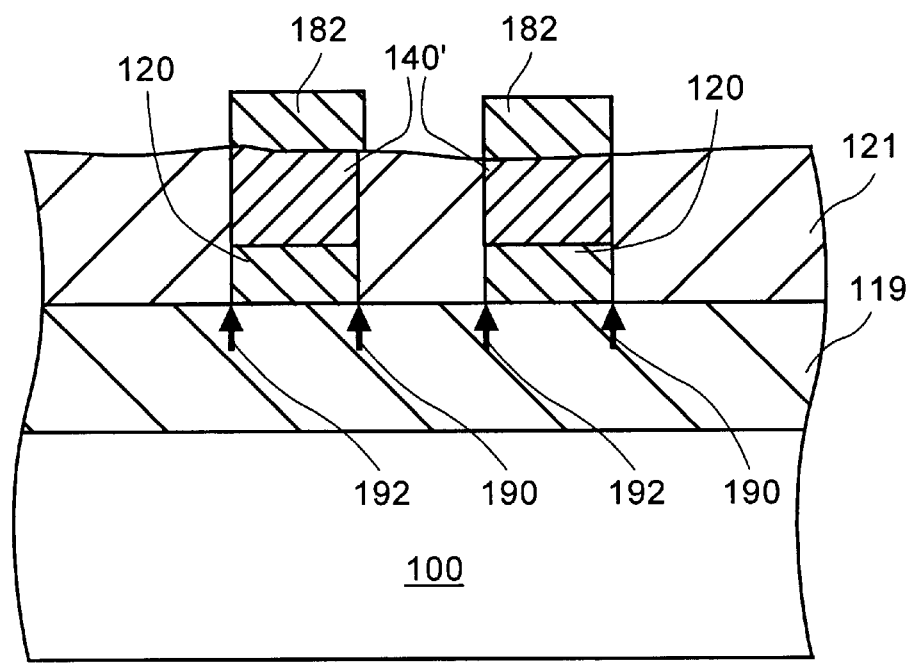

FIG. 6C shows the semiconductor device of FIG. 6A when the photoresist mask patterns 152 and 152' are re-sized to avoid producing thinner conductive vias in accordance with an alternative embodiment of the present invention. As shown, the conductive via 140' is now perfectly aligned to both the right edge 190 and a left edge 192 due to the re-sizing (Rs) performed in FIG. 5H. In a like manner, FIG. 6D shows the semiconductor device of FIG. 6B after the photoresist mask patterns 152 and 152' are re-sized to avoid producing the thinner conductive vias. Of course, when the re-sizing is performed, the conductive via 140' will necessary have a lower resistance.

Tables A through C below are provided to illustrate the exemplary parameters used in performing the various plasma chamber etching operations described as Etch-1, Etch-2, Etch-3, and Etch-4. Although any type of plasma etcher may be used, preferred etchers may be obtained from Lam Research Corporation of Fremont, Calif. In a specific example, a LAM Research 9600 SE may be used to perform the etching operations of Table A and Table B. In a like manner, a LAM Research 4520XL may be used to perform the etching operations of Table C. Further, although the following parameters are associated with an exemplary "6 inch wafer," the parameters may be modified for application to substrates of varying sizes and shapes, such as those employed in the manufacture of semiconductor devices. Further yet, it should be understood that the advantageous self-aligning conductive vias described herein may be fabricated in 0.35, 0.25, 0.18, 0.15 and smaller micron technology processes.

TABLE A

Exemplary Etch Chemistry A
$Cl_2/BCL_3$

| | Top Power (watts) | Bottom Power (watts) | Flow Rate | | Pressure | Temp |
|---|---|---|---|---|---|---|
| Approximate Range | 250 to 700 | 50 to 300 | 30–90 sccms $Cl_2$ | 10–60 sccms $BCL_3$ | 5 mTorr– 40 mTorr | 20° C. to 90° C. |
| Approximate Preferred Range | 350 to 550 | 100 to 250 | 40–80 sccms $Cl_2$ | 20–40 sccms $BCL_3$ | 10 mTorr– 30 mTorr | 30° C. to 70° C. |
| Approximate More Preferred Range | 450 | 175 | 60 sccms $Cl_2$ | 30 sccms $BCL_3$ | 20 mTorr | 50° C. |

TABLE B

Exemplary Etch Chemistry B
$BCl_3/SF_6$

| | Top Power (watts) | Bottom Power (watts) | Flow Rate | SCCM | Pressure | Temp |
|---|---|---|---|---|---|---|
| Approximate Range | 250 to 700 | 50 to 300 | 10–50 sccms $BCl_3$ | 5–50 sccms $SF_6$ | 5 mTorr– 40 mTorr | 20° C. to 90° C. |
| Approximate Preferred Range | 400 to 500 | 100 to 200 | 20–40 sccms $BCl_3$ | 7–40 sccms $SF_6$ | 10 mTorr– 25 mTorr | 30° C. to 70° C. |
| Approximate More Preferred Range | 450 | 150 | 30 sccms $BCl_3$ | 15 sccms $SF_6$ | 15 mTorr | 50° C. |

TABLE C

Exemplary Etch Chemistry C
$O_2/CHF_3$

| | Top Power (watts) | Bottom Power (watts) | Flow Rate | | Pressure | Temp |
|---|---|---|---|---|---|---|
| Approximate Range | 200 to 1000 | 300 to 2000 | 20–100 sccms $O_2$ | 2–15 sccms $CHF_3$ | 100 mTorr– 400 mTorr | 0° C. to 40° C. |
| Approximate Preferred Range | 300 to 700 | 500 to 1500 | 30–60 sccms $O_2$ | 3–7 sccms $CHF_3$ | 150 mTorr– 250 mTorr | 5° C. to 15° C. |
| Approximate More Preferred Range | 500 | 800 | 45 sccms $O_2$ | 5 sccms $CHF_3$ | 200 mTorr | 10° C. |

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A process for making a self-aligning conductive via structure in a semiconductor device, comprising:

forming a first interconnect metallization layer over an oxide layer;

forming an etch stop layer over the first interconnect metallization layer;

forming a conductive via metallization layer over the etch stop layer;

forming a hard mask layer over the conductive via metallization layer;

patterning the hard mask layer and the conductive via metallization layer to produce an outline of a first interconnect metal layout, the patterning being configured to remove portions of the hard mask layer and portions of the conductive via metallization layer in regions other than the outline of the first interconnect metal layout; and producing a conductive via and an interconnect line, the conductive via being formed from a portion of the conductive via metallization layer, the interconnect line being formed from a portion of the first interconnect metallization layer, the conductive via being substantially aligned with the interconnect line that is defined at the outline of the first interconnect metal layout, wherein the producing of the conductive via and the interconnect line comprises:

patterning a remainder of the hard mask layer over the outline of the first interconnect metal layout to leave a hard mask pad over the conductive via metallization layer; and removing the conductive via metallization layer within the outline of the first interconnect metal layout that is not covered by the hard mask pad and substantially simultaneously removing the first interconnect metallization layer down to the oxide layer in regions other than the outline of the first interconnect metal layout;

whereby the conductive via is formed from the conductive via metallization remaining under the hard mask pad, and the conductive via is substantially aligned with the interconnect line formed from the first interconnect metallization layer within the outline of the first interconnect metal layout.

2. A process for making a self-aligning conductive via structure in a semiconductor device, comprising:

forming a first interconnect metallization layer over an oxide layer, wherein the first interconnect metallization layer is a tri-layer including a first barrier layer, an aluminum/copper layer and an anti-reflective layer;

forming an etch stop layer over the first interconnect metallization layer;

forming a conductive via metallization layer over the etch stop layer;

forming a hard mask layer over the conductive via metallization layer;

patterning the hard mask layer and the conductive via metallization layer to produce an outline of a first interconnect metal layout by using the etch stop layer as a stop point, the patterning being configured to remove portions of the hard mask layer and portions of the conductive via metallization layer in regions other than the outline of the first interconnect metal layout; and producing a conductive via and an interconnect line, the conductive via being formed from a portion of the conductive via metallization layer, the interconnect line being formed from a portion of the first interconnect metallization layer, the conductive via being substantially aligned with the interconnect line that is defined at the outline of the first interconnect metal layout.

3. A process for making a self-aligning conductive via structure in a semiconductor device as recited in claim 2, wherein the forming the etch stop layer comprises:

depositing a material selected from the group consisting of titanium tungsten, tungsten, and tungsten silicide, to a thickness of between about 200 and 1,000 angstroms.

4. A process for making a self-aligning conductive via structure in a semiconductor device as recited in claim 3, wherein the forming of the conductive via metallization layer over the etch stop layer comprises:

depositing an aluminum/copper layer to a thickness of between about 3,000 and 10,000 angstroms; and depositing an anti-reflective layer to a thickness of between about 100 angstroms and about 800 angstroms.

5. A process for making a self-aligning conductive via structure in a semiconductor device as recited in claim 4, wherein the forming of the hard mask layer over the conductive via metallization layer comprises:

depositing a material selected from the group consisting of a silicon nitride, a silicon dioxide, and a silicon oxy nitride, to a thickness of between about 500 angstroms and about 2000 angstroms.

6. A process for making a self-aligning conductive via structure in a semiconductor device as recited in claim 1, wherein patterning the hard mask layer and the conductive via metallization layer comprises:

applying a photoresist pattern over the hard mask layer to produce the outline of a first interconnect metal layout;

etching the hard mask layer that is not covered by the applied photoresist with an $O_2/CHF_3$ chemistry; and etching the conductive via metallization layer that is not covered by the applied photoresist with a $Cl_2/BCl_3$ chemistry.

7. A process for making a self-aligning conductive via structure in a semiconductor device as recited in claim 1, wherein patterning the hard mask layer over the outline of the first interconnect metal layout to leave a hard mask pad over the conductive via metallization layer comprises:

applying a via photoresist pattern over the hard mask layer defined over the outline of the first interconnect metal layout;

etching the hard mask layer defined over the outline of the first interconnect metal layout not covered by the via photoresist pattern with an $O_2/CHF_3$ chemistry.

8. A process for making a self-aligning conductive via structure in a semiconductor device as recited in claim 1, wherein the removing comprises:

etching the conductive via metallization layer and the first interconnect metallization layer with a $Cl_2/BCl_3$ chemistry.

9. A process for making a self-aligning conductive via structure in a semiconductor device, comprising:

forming a first interconnect metallization layer over an oxide layer;

forming an etch stop layer over the first interconnect metallization layer;

forming a conductive via metallization layer over the etch stop layer;

forming a hard mask layer over the conductive via metallization layer;

patterning the hard mask layer and the conductive via metallization layer to produce an outline of a first interconnect metal layout, the patterning being configured to remove portions of the hard mask layer and portions of the conductive via metallization layer in regions other than the outline of the first interconnect metal layout;

producing a conductive via and an interconnect line, the conductive via being formed from a portion of the conductive via metallization layer, the interconnect line being formed from a portion of the first interconnect metallization layer, the conductive via being substantially aligned with the interconnect line that is defined at the outline of the first interconnect metal layout, wherein the producing of the conductive via and the interconnect line comprises:

patterning a remainder of the hard mask layer over the outline of the first interconnect metal layout to leave a hard mask pad over the conductive via metallization layer by applying a via photoresist pattern over the hard mask layer defined over the outline of the first interconnect metal layout and by etching the hard mask layer defined over the outline of the first interconnect metal layout not covered by the via photoresist pattern with an $O_2/CHF_3$ chemistry;

re-sizing the via photoresist pattern to compensate for photolithography misalignments; and removing the conductive via metallization layer within the outline of the first interconnect metal layout that is not covered by the hard mask pad and substantially simultaneously removing the first interconnect metallization layer down to the oxide layer in regions other than the outline of the first interconnect metal layout;

whereby the conductive via is formed from the conductive via metallization remaining under the hard mask pad, and the conductive via is substantially aligned with the interconnect line formed from the first interconnect metallization layer within the outline of the first interconnect metal layout.

10. A process for making a self-aligning conductive via structure in a semiconductor device as recited in claim 1, wherein the process produces a semiconductor device having the conductive via formed over the interconnect line is a substantially aligned orientation.

11. A semiconductor structure, comprising:

a substrate having at least one active device;

a first dielectric layer lying over the substrate;

a first metal interconnect line being patterned over the surface of the first dielectric layer, wherein the first metal interconnect line is a tri-layer including a first barrier layer, an aluminum/copper layer and an anti-reflective layer;

an etch stop layer lying over the first metal interconnect line that is patterned over the surface of the first dielectric layer; and a discrete conductive via structure lying over the etch stop layer that is over the first metal interconnect line, the discrete conductive via structure being substantially perpendicularly aligned with the first metal interconnect line, the first metal interconnect line and the discrete conductive via are perpendicularly aligned due to an etching through a hard mask that is configured to define the discrete conductive via structure and the first metal interconnect line.

12. A semiconductor structure as recited in claim 11, wherein a second dielectric layer covers the first metal interconnect line and the discrete conductive via down to the first dielectric layer.

13. A semiconductor structure as recited in claim 12, wherein a second metal interconnect line is patterned over the surface of the second dielectric layer such that an electrical interconnection is made between the first metal interconnect line and the second metal interconnect line through the discrete conductive via.

14. A semiconductor structure as recited in claim 13, wherein the tri-layer has a thickness of between about 3,000 angstroms and about 12,000 angstroms.

15. A semiconductor structure as recited in claim 14, wherein the etch stop layer is a material selected from the group consisting of titanium tungsten, tungsten, and tungsten silicide, and the material has a thickness of between about 200 angstroms and about 1,000 angstroms.

16. A semiconductor structure as recited in claim 15, wherein the discrete conductive via structure has a thickness of between about 3,000 angstroms and about 12,000 angstroms.

* * * * *